United States Patent
Noda et al.

(10) Patent No.: US 7,450,446 B2
(45) Date of Patent: Nov. 11, 2008

(54) SEMICONDUCTOR MEMORY DEVICE HAVING DELAY CIRCUIT

(75) Inventors: Hiromasa Noda, Tokyo (JP); Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/598,566

(22) Filed: Nov. 14, 2006

(65) Prior Publication Data

US 2007/0121394 A1 May 31, 2007

(30) Foreign Application Priority Data

Nov. 18, 2005 (JP) ............................. 2005-335008

(51) Int. Cl.
*G11C 7/00* (2006.01)
(52) U.S. Cl. ............. 365/194; 365/189.07; 365/189.09
(58) Field of Classification Search ................. 365/194, 365/189.07, 210, 189.09
See application file for complete search history.

(56) References Cited

U.S. PATENT DOCUMENTS 6,181,637 B1  1/2001  Nishimura et al.
6,469,557 B2 *  10/2002  Hirabayashi ................ 327/263
6,629,251 B1 *  9/2003  Anderson et al. ........... 713/401
6,738,296 B2 *  5/2004  Sung et al. ............. 365/189.07
7,012,847 B2 *  3/2006  Song ........................... 365/205

FOREIGN PATENT DOCUMENTS

JP      2000-285672 A     10/2000

* cited by examiner

*Primary Examiner*—Connie C Yoha
(74) *Attorney, Agent, or Firm*—McDermott Will & Emery LLP (57) ABSTRACT

Disclosed is a semiconductor memory device configured to delay an input signal in accordance with a clock signal having a clock period. The semiconductor memory device comprises a reference signal generator and a delay circuit. The reference signal generator configured to generate a reference signal in accordance with the clock signal. The reference signal indicates a reference delay time representing the clock period. The delay circuit configured to delay input signal for a delay time to generate a delayed signal in accordance with the reference signal. The delay time is obtainable by multiplying the reference delay time by a positive integer.

20 Claims, 7 Drawing Sheets

| CL | number of repetitions of the reference delay times |
|---|---|
| 5 | 3 |
| 6 | 4 |
| 7 | 4 |
| 8 | 5 |
| 9 | 6 |
| 10 | 6 |

FIG.8

| specification | | | | configuration | | difference between tRCD and delay time |
|---|---|---|---|---|---|---|
| data rate (MHz) | tCK (ns) | CL (tCK) | tRCD (ns) | number of repetitions of reference delay times (set) | delay time (ns) | (ns) |
| 800 | 2.5 | 5 | 12.5 | 3 | 7.5 | 5.0 |
| 800 | 2.5 | 6 | 15 | 4 | 10.0 | 5.0 |
| 1066 | 1.875 | 6 | 11.25 | 4 | 7.5 | 3.8 |
| 1066 | 1.875 | 7 | 13.125 | 4 | 7.5 | 5.6 |
| 1066 | 1.875 | 8 | 15 | 5 | 9.4 | 5.6 |
| 1333 | 1.5 | 7 | 10.5 | 4 | 6.0 | 4.5 |
| 1333 | 1.5 | 8 | 12 | 5 | 7.5 | 4.5 |
| 1333 | 1.5 | 9 | 13.5 | 6 | 9.0 | 4.5 |
| 1600 | 1.25 | 8 | 10 | 5 | 6.3 | 3.8 |
| 1600 | 1.25 | 9 | 11.25 | 6 | 7.5 | 3.8 |
| 1600 | 1.25 | 10 | 12.5 | 6 | 7.5 | 5.0 |

421

SEMICONDUCTOR MEMORY DEVICE HAVING DELAY CIRCUIT

BACKGROUND OF THE INVENTION

The present invention generally relates to a semiconductor memory device. More particularly, the present invention relates to a semiconductor memory device comprising a delay circuit configured to delay an input signal to generate a delayed signal.

JP-A 2000-285672 discloses a semiconductor memory device comprising a delay circuit adapted to delay a row address strobe signal for a delay time to generate a latch enable signal. The delay time is shortened or elongated by a change in voltage. The disclosed semiconductor memory device prevents generation of the shortened delay time. The elongated delay time still exists.

SUMMARY OF THE INVENTION

It is an object of the present invention to provide a semiconductor memory device for generating a delayed signal for a delay time which is more highly stabilized than the disclosed technique.

According to an aspect of the present invention, there is provided a semiconductor memory device configured to delay an input signal in accordance with a clock signal having a clock period. The semiconductor memory device comprises a reference signal generator and a delay circuit. The reference signal generator configured to generate a reference signal in accordance with the clock signal. The reference signal indicates a reference delay time representing the clock period. The delay circuit configured to delay input signal for a delay time to generate a delayed signal in accordance with the reference signal. The delay time is obtainable by multiplying the reference delay time by a positive integer.

These and other objects, features and advantages of the present invention will become more apparent upon reading of the following detailed description along with the accompanied drawings.

DESCRIPTION OF PREFERRED EMBODIMENTS

Figure 1:
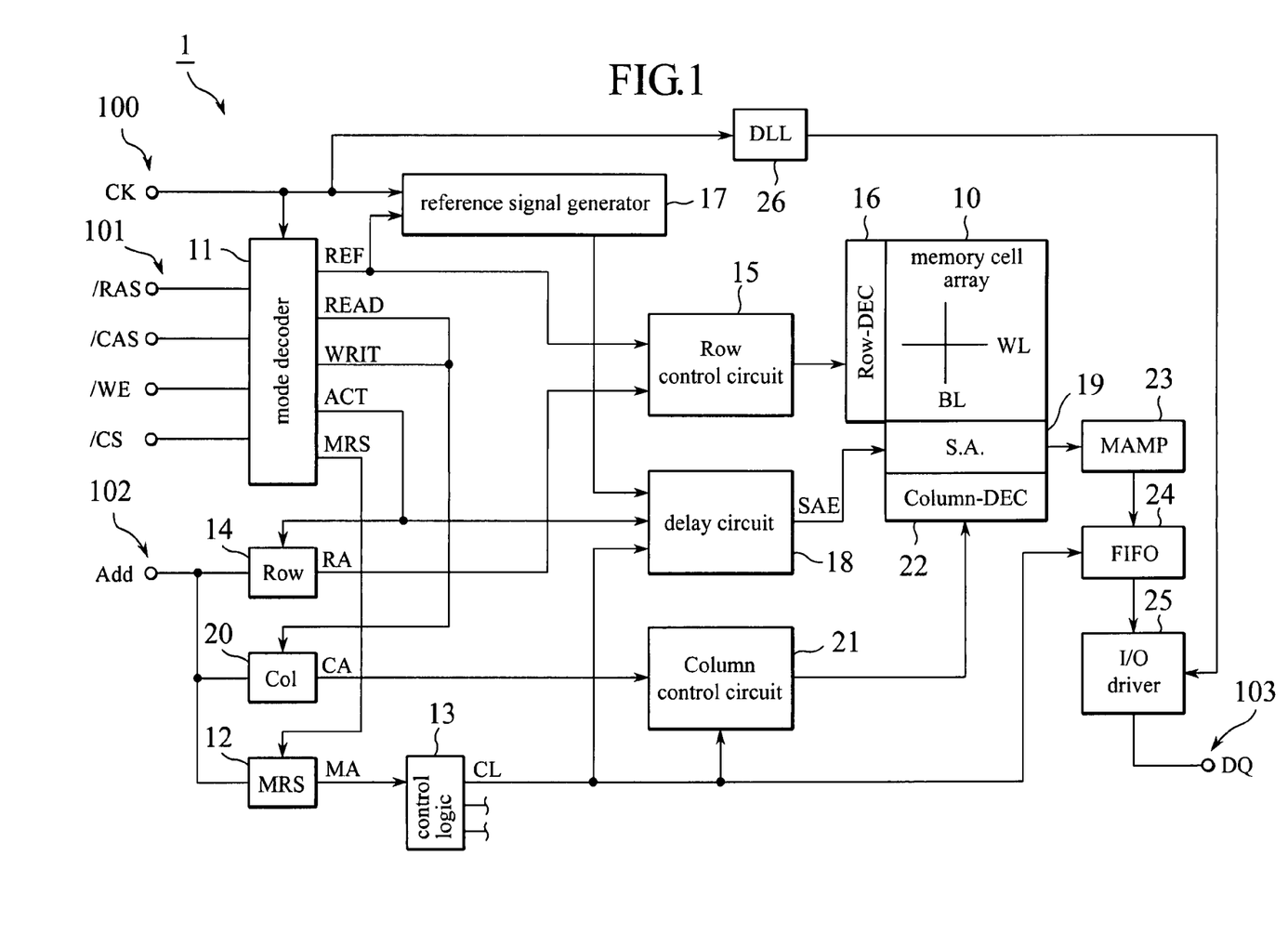
FIG. 1 is a block diagram of a semiconductor memory device of an embodiment of the present invention.

Referring to FIG. 1, the semiconductor memory device 1 of this embodiment of the present invention is a double data rate synchronous dynamic random access memory (DDR-SDRAM). The semiconductor memory device 1 comprises a memory cell array 10, a mode decoder 11, a mode resistor 12, a control logic 13, a row address latch circuit 14, a row control circuit 15, a row decoder (Row-DEC) 16, a reference signal generator 17, a delay circuit 18, a sense amplifier (S.A.) 19, a column address latch circuit 20, a column control circuit 21, a column decoder (Column-DEC) 22, a main amplifier (MAMP) 23, an input/output (I/O) register (FIFO) 24, a I/O driver 25, delay-locked loop (DLL) 26, a clock (CK) input terminal 100, a plurality of command input terminals 101, a plurality of address input terminals 102 and a plurality of data I/O terminals 103.

The memory cell array 10 comprises a plurality of memory cells, a plurality of word lines (WLs) and a plurality pairs of complementary bit lines (BLs). The memory cells are arranged in a matrix to be selected by the word lines. The complementary bit lines transmit signals stored in selected memory cells.

The mode decoder 11 receives a plurality of signals, such as a row address strobe (/RAS) signal, a column address strobe (/CAS) signal, a write enable (/WE) signal and a chip select (/CS) signal at the command input terminals 101 in synchronization with a clock signal input from the clock input terminal 100. The mode decoder 11 generates a plurality of commands, such as a read (READ) command, a write (WRIT) command, an active (ACT) command, a mode resister set (MRS) command and a refresh (REF) command in accordance with the signals received at the command input terminals 101.

The mode decoder 11 receives signals to be decoded into the READ command upon a lapse of one clock cycle of the clock signal after receiving the ACT command. The READ command is asserted $t_{RCD}$ after receiving the ACT command. The mode decoder 11 outputs the READ command when the READ command is asserted. The period $t_{RCD}$ of this embodiment is equal to a read latency (CL). The CL shows how many clock cycles should be elapsed until signals stored in memory cells is output on the data I/O terminals 103 after the READ command is asserted. The CL is set in the semiconductor memory 1 of this embodiment so as to determine a timing at which the READ command is asserted without receiving the value $t_{RCD}$.

The mode register 12 receives signals at the address input terminals 102 upon receiving the MRS command from the mode decoder 11.

The control logic 13 decodes the signal latched in the mode register 12. The decoded signals include the CL.

The row address latch circuit 14 receives signals including a row address at the address input terminals 102, in response to the ACT command.

The row control circuit 15 receives the row address at the row address latch circuit 14 and outputs the row address to the row decoder 16. The row control circuit 15 generates refresh row addresses in response to the REF command.

The row decoder 16 activates a word line corresponding to the row address. Memory cells connected with an activated word line outputs signals stored in the memory cells to corresponding bit lines.

The reference signal generator 17 receives the clock signal at the clock input terminal 100 and the REF command at the mode decoder 10. In this embodiment, the reference signal generator 17 generates a reference signal in response to the REF command. The reference signal transmits a reference delay time representing clock period of the clock signal. The reference delay time consists of a common offset delay time and one or more of the unit delay time. The reference delay time is not limited to be equal to the clock period completely.

The delay circuit 18 receives the reference signal from the reference signal generator 17 and the ACT command from the mode decoder 11. The delay circuit 18 delays the ACT command for a delay time to generate a sense amplifier enable (SAE) signal. The delay time is obtainable by multiplying the reference delay time by a positive integer.

The sense amplifier 19 amplifies signals on the complementary bit lines. The semiconductor memory device further comprises a plurality of I/O lines and a plurality of column switches (YS) configured to connect the complementary bit lines to the I/O lines, respectively. The sense amplifier 19 is activated by the SAE signal so as to amplify signals on the complementary bit lines after signals of memory cells are sufficiently transferred to the complementary bit lines before the column switches are activated. The delay circuit 18 generates the SAE signal in consideration of a time period from input of the ACT command at the mode decoder 11 to input of the ACT command at the delay circuit 18. Further, the SAE signal is generated in consideration of the delay time of the delay circuit 18 and a time period from output of the SAE command at the delay circuit 18 to activation of the sense amplifier 19.

The column address latch circuit 20 receives signals including a column address at the address input terminals 102 when the READ command or the WRIT command is input from the mode decoder 11.

The column control circuit 21 receives the column address from the column address latch circuit 20 and the CL from the control logic 13. The column control circuit 21 outputs the column address to the column decoder 22 so that amplified signals on the complementary bit lines indicated by the column address is output on the data I/O terminals 103 at a timing indicated by the CL.

The column decoder 22 selects the column switches in accordance with the column address so that the signals on the complementary bit lines are transferred to the I/O lines.

The MAMP 23 amplifies the signals on the I/O lines. The FIFO 24 buffers the signals amplified by the MAMP 23 and outputs buffered signals. The I/O driver 25 outputs the buffered signals to the data I/O terminals 103. The DLL 26 is configured to adjust a timing of an output of signals.

Figure 2:
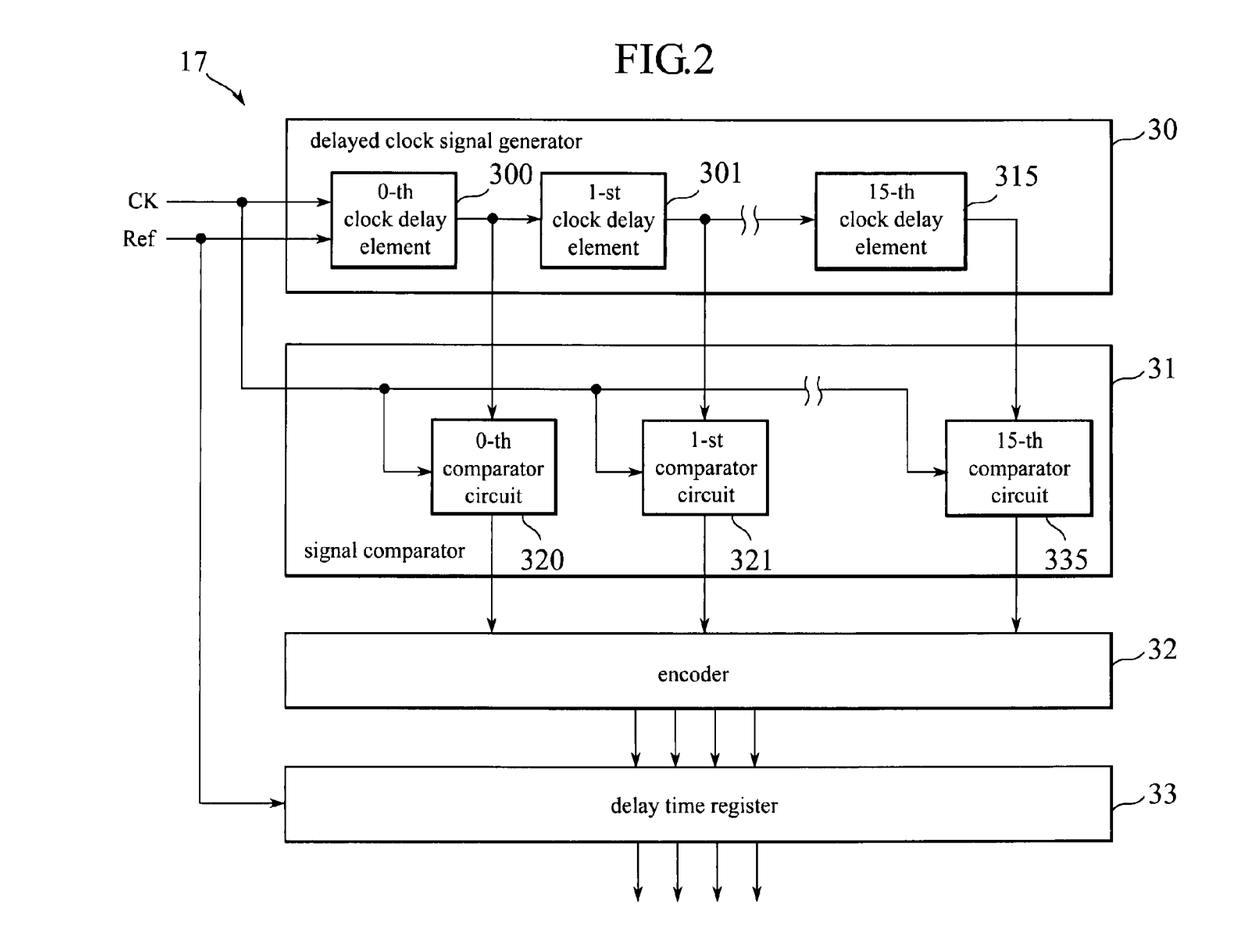
FIG. 2 is a block diagram of the reference signal generator of FIG. 1.

With reference to FIG. 2, the reference signal generator 17 comprises a delayed clock signal generator 30, a signal comparator 31, an encoder 32 and a delay time register 33.

The delay clock signal generator 30 comprises zeroth to fifteenth clock delay elements 300 to 315 configured to generate zeroth to fifteenth delayed clock signal, respectively. Each of the zeroth to the fifteenth clock delay elements 300 to 315 of this embodiment has a structure same as the others. The zeroth clock delay element 300 delays the clock signal for the unit delay time to generate the zeroth delayed clock signal. The $N_1$-th clock delay element delays the $(N_1-1)$-th delayed clock signal for the unit delay time to generates the $N_1$-th delayed clock signal where $N_1$ is an integer from one to fifteen. The zeroth to the fifteenth delayed clock signals are further delayed for a common offset delay time.

The signal comparator 31 comprises zeroth to fifteenth comparator circuits 320 to 335. Each of the zeroth to the fifteenth comparator circuits 320 to 335 of this embodiment has a structure same as the others. The zeroth to the fifteenth comparator circuits 320 to 335 compare the zeroth to the fifteenth delayed clock signals with the clock signal, respectively, so as to detect whether the zeroth to the fifteenth delayed clock signals are approximately equal to the clock period or not, respectively.

Figure 3:
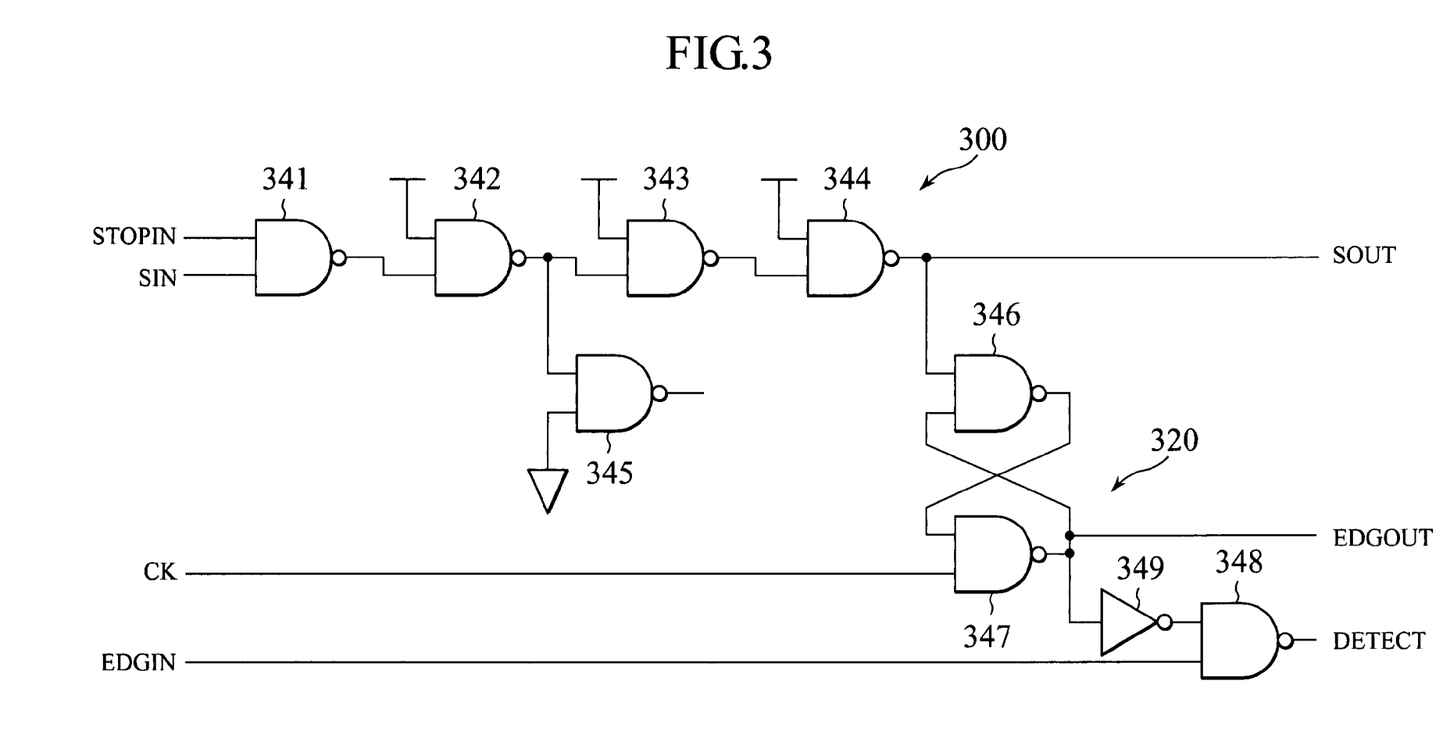
FIG. 3 is a logic circuit diagram of the clock delay element of FIG. 2.

FIG. 3 shows the zeroth clock delay element 300 and the zeroth comparator circuit 320 of this embodiment. The zeroth clock delay element 300 comprises first to fifth NAND circuits 341 to 345. The first NAND circuit 341 receives a STOPIN signal and a SIN signal. The first NAND circuit 341 receives the REF command as the STOPIN signal and the clock signal as the SIN signal. The clock signal is delayed by the first to the fourth NAND circuits 341 to 344, in turn, for the unit delay time and output as the SOUT signal. The SOUT signal of the $N_2$-th clock delay element is the SIN signal of the $(N_2+1)$-th clock delay element where $N_2$ is an integer from one to fourteen. When the zeroth clock delay element 300 receives the REF command which is at a high level, the delay circuit 30 is activated. When the zeroth clock delay element 300 does not receives the REF command, or a signal of a low level as the STOPIN signal, the delay circuit 30 is not activated. The fifth NAND circuit 345 is configured to adjust the unit delay time.

Referring to FIG. 3, the zeroth comparator circuit 320 comprises sixth to eighth NAND circuits 346 to 348 and a NOT circuit 349. The zeroth delayed clock signal is delayed by the sixth NAND circuit 346 for the common offset delay time and then compared by the seventh NAND circuit 347 with the clock signal.

The $N_3$-th comparator circuit receives the $N_3$-th delayed clock signal further delayed by the six NAND circuit 346. The $N_3$-th comparator circuit further receives the clock signal and an EDGIN signal and outputs an EDGOUT signal and a DETECT signal. The EDGOUT signal of the $N_3$-th comparator circuit is input to the $(N_3+1)$-th comparator circuit as the EDGIN signal where $N_3$ is an integer of zero to fourteen. The EDGIN signal of the zeroth comparator circuit is at a high level during generating the reference signal.

The clock signal includes a first rising edge and a second rising edge. The rising edges of the zeroth to the fifteen delayed clock signal are generated by delaying the first rising edge. The second rising edge appears after the first rising edge.

If the rising edge of the $N_4$-th delayed clock signal further delayed by the six NAND circuit 346 (hereinafter referred to as delayed rising edge) rises earlier than the second rising edge, and the difference between the delayed rising edge and the second rising edge is half the clock period or more, the EDGOUT signal is set at a low level where $N_4$ is an integer from zero to fifteen. If the delayed rising edge rises earlier than the second rising edge and the difference between the delayed rising edge and the second rising edge is less than half the clock period, the EDGOUT signal is set at a high level. If the delayed rising edge rises later than the second rising edge, and the difference between the delayed rising edge and the second rising edge is less than half the clock period, the EDGOUT signal is set at a low level.

Only if the EDGIN signal is at a high level and the EDGOUT is at a low level, the eighth NAND circuit 348 and the NOT circuit 349 set the DETECT signal at a low level. Therefore, only if the delayed rising edge of the $N_5$-th delayed signal rises later than the second rising edge and the delayed rising edge of the $(N_5-1)$-th delayed signal rises earlier than the second rising edge, the DETECT signal is set at a low level and thus $N_5$ is a particular number of the unit delay times required to form the reference delay time representing the clock period.

The DETECT signals generated by the zeroth to the fifteenth comparator circuits 320 to 335 forms the reference signal which is a 16-bit signal. The reference signal indicates the particular number of the unit delay times required to form the reference delay time representing the clock period. The reference delay time is a sum of a common offset delay time and one or more of the unit delay times. The encoder 32 encodes the reference signal and generates an encoded reference signal which is a 4-bit signal.

The delay time register 33 stores the encoded reference signal.

Figure 4:
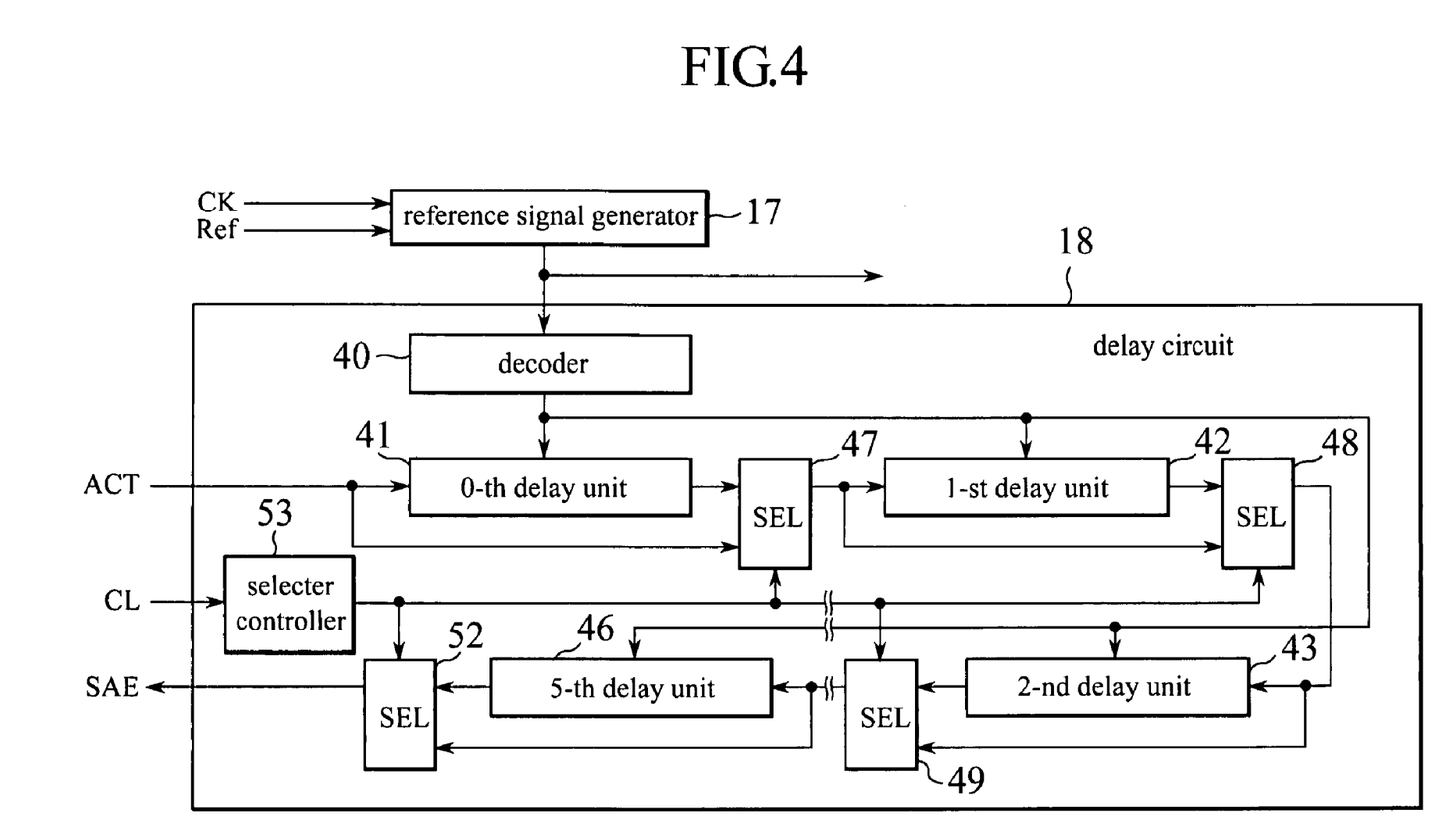
FIG. 4 is a block diagram of the delay circuit of FIG. 1.

Referring to FIG. 4, the delay circuit 18 comprises a decoder 40, zeroth to fifth delay units 41 to 46, zeroth to fifth selectors 47 to 52 and a selector controller 53.

The decoder 40 decodes the encoded reference signal stored in the delay time register 33 of the reference signal generator 17.

Each of the zeroth to the fifth delay units 41 to 46 has a structure same as the others. The zeroth to the fifth delay units 41 to 46 receive zeroth to fifth input signals, respectively, and the decoded reference signal from the decoder 40. The first to the sixth delay units 41 to 46 output zeroth to fifth delayed signals generated by delaying the zeroth to the fifth input signals for the reference delay time indicated by the reference signal, respectively.

Figure 5:
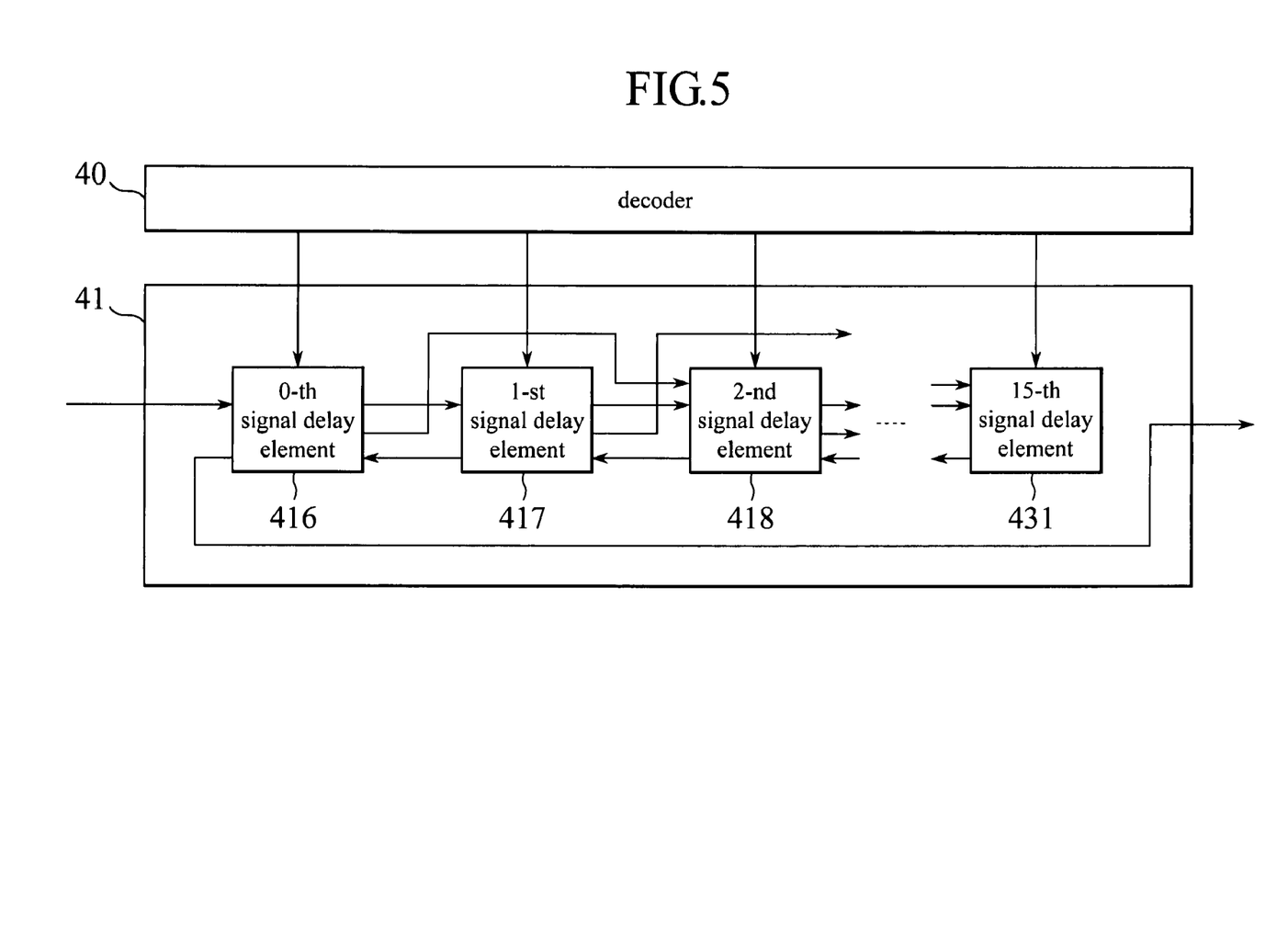
FIG. 5 is a block diagram of the delay unit of FIG. 4.

Referring to FIG. 5, the $N_6$-th delay units comprises zeroth to fifteenth signal delay elements 416 to 431 where the $N_6$ is an integer from zero to five.

Figure 6:
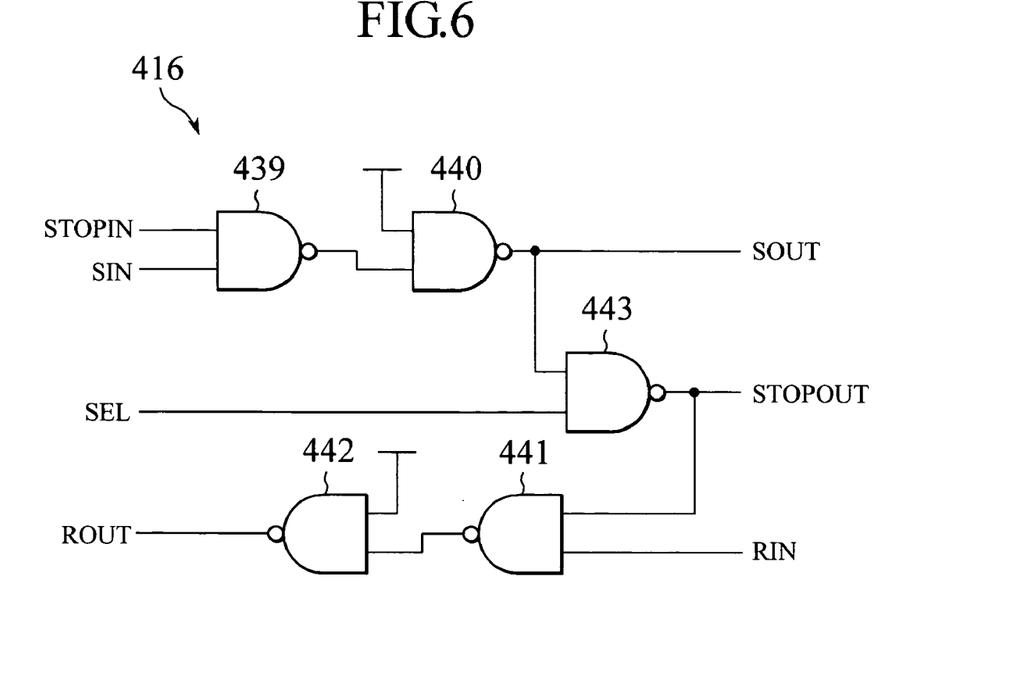
FIG. 6 is a logic circuit diagram of the signal delay element of FIG. 5.

Referring to FIG. 6, the $N_7$-th signal delay element comprises a ninth to the thirteenth NAND circuits 439 to 443 where the $N_7$ is an integer from zero to fifteen. The $N_7$-th signal delay element receives an STOPIN signal, an SIN signal, an SEL signal and an RIN signal and outputs an SOUT signal, an STOPOUT signal and an ROUT signal.

The SIN signal of the zeroth signal delay element 416 is the $N_6$-th input signal of the $N_6$-th delay unit. The SIN signal of the $N_8$-th signal delay element is the SOUT signal of the $(N_8-1)$-th signal delay element where $N_8$ is an integer from one to fifteen. The ninth and the tenth NAND circuits 439 and 440 are connected in series and delay the SIN signal to generate the SOUT signal.

The decoded reference signal is divided into the SEL signals to be input into the zeroth to the fifteenth signal delay elements 416 to 431. If the reference signal indicates that the particular number of unit delay times required to form the reference delay time is $N_9$, the SEL signal to be input into the $(N_9-1)$-th signal delay element is set at a high level and rest SEL signals are set at a low level. Only if the SEL signal is high, the thirteenth NAND circuit 443 transfers the SOUT signal to the eleventh NAND circuit 441. If the SEL signal is low, the thirteenth NAND circuit 443 separates the eleventh NAND 441 circuit from the tenth NAND circuit 440.

The ROUT signal to be output from the zeroth signal delay element 416 of the $N_{10}$-th delay unit is the $N_{10}$-th delayed signal where $N_{10}$ is an integer from zero to fourteen. The RIN signal of the $N_{11}$-th signal delay element is the ROUT signal of the $(N_{11}+1)$-th signal delay element where the $N_{11}$ is an integer from zero to fourteen. The eleventh and the twelfth NAND circuits 441 and 442 are connected in series. If the thirteenth NAND circuit 443 separates the eleventh NAND circuit 441 from the tenth NAND circuit 440, the eleventh and the twelfth NAND circuits 441 and 442 delays the RIN signal to generate the ROUT signal. If the thirteenth NAND circuit 443 transfers the SOUT signal to the eleventh NAND circuit 441, the eleventh and the twelfth NAND circuits 441 and 442 delays the SOUT signal to generate the ROUT signal.

The ninth to the twelfth NAND circuits 439 to 442 delay a signal for the unit delay time in total. The thirteenth NAND circuit 443 delays a signal for the common offset delay time.

The STOPIN signal of the $N_{12}$-th signal delay element is the STOPOUT signal of the $(N_{12}-2)$-th signal delay elements where $N_{12}$ is an integer from two to fifteenth. The STOPIN signals of the zeroth and the first signal delay elements are high. If the STOPIN signal of the $N_{13}$-th signal delay element is at a high level, the $N_{13}$-th signal delay element is activated where $N_{13}$ is an integer from zero to fifteen. If the STOPIN signal of the $N_{13}$-th signal delay element is at low, the $N_{13}$-th signal delay element is inactivated.

When the particular number of unit delay times required to form the reference delay time indicated by the reference signal is $N_{14}$, the SIN signal input into the zeroth signal delay element 416 is delayed by the ninth to the twelfth NAND circuits 439 to 442 of the zeroth to the $(N_{14}-1)$-th signal delay elements. The SIN signal of the zeroth signal delay element 416 further delayed by the thirteenth NAND circuit of the $(N_{14}-1)$-th signal delay element 416 for the common offset delay time.

The zeroth to the fifth selectors and the selector controller form a selection portion to select how many delay units of the zeroth to the fifth delay units 41 to 46 should be used to delay the input signal in accordance with the CL.

The $N_{15}$-th selector outputs either one of the $N_{15}$-th input signal or the $N_{15}$-th delayed signal where the $N_{15}$ is an integer form zero to five. The zeroth input signal is the ACT command. The $(N_{16}+1)$-th input signal is a signal output from the $N_{16}$-th selector where $N_{16}$ is an integer from one to four. The signal output from the fifth selector 52 is the SAE command.

Figure 7:
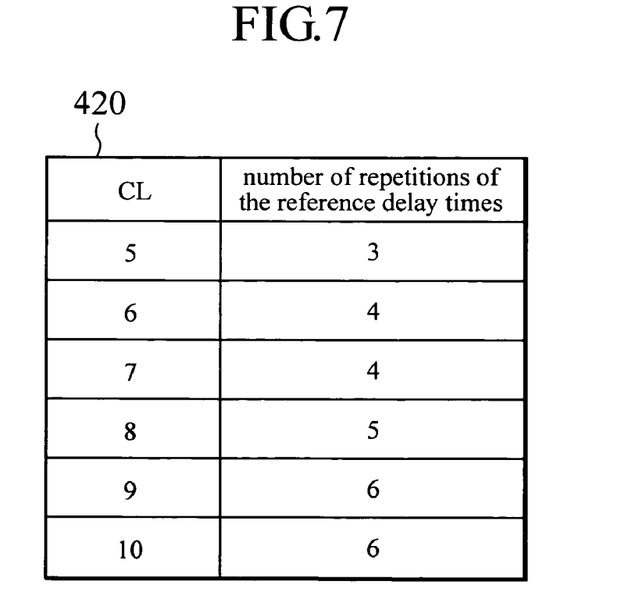
FIG. 7 is a table showing a relation between read latencies (CL) and numbers of repetitions of the reference delay times.

The selector controller 53 has a table 420 illustrated in FIG. 7. The table 420 shows a relation between the CLs and numbers of repetitions of the reference delay times required to form intended delay time. The numbers of repetitions of the reference delay times are 3, 4, 4, 5, 6 and 6 for the CL of 5, 6, 7, 8, 9 and 10, respectively. The selector controller 53 controls the zeroth to the fifth selectors 47 to 52 in accordance with the number of repetitions of the reference delay times corresponding to the CL received from the control logic 13. The selector controller 53 may receive another signal which indicates the $t_{RCD}$ directly or indirectly instead of the CL. If the number of repetitions of the reference delay times is $N_{17}$ where $N_{17}$ is less than six, the zeroth to the $(N_{17}-1)$-th selectors are controlled to output the zeroth to the $(N_{17}-1)$-th delayed signals, respectively, and the $N_{17}$-th to the fifth selectors are controlled to output the $N_{17}$-th to the sixth input signals, respectively. If the number of repetitions of the reference delay times is six, the zeroth to the fifth selectors are controlled to output the zeroth to the fifth delayed signals, respectively. The delay circuit 18 delays the ACT command for a delay time to generates the SAE signal. The delay time is obtained by multiplying the reference delay time by $N_4$.

Figure 8:
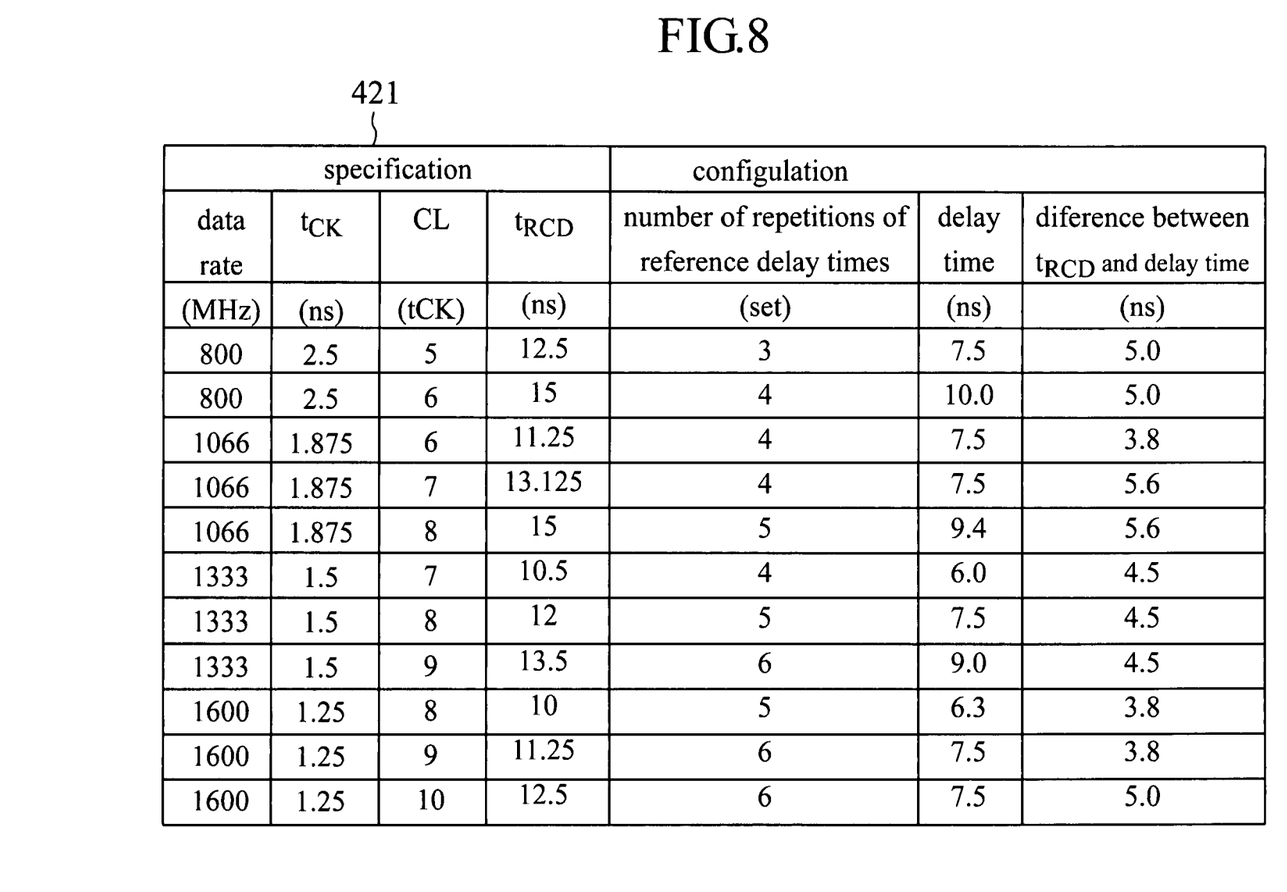
FIG. 8 is a table showing a relation between a specification of the semiconductor memory device and a configuration of the delay circuit.

FIG. 8 is a table 421 which shows a relation between a specification of the semiconductor memory device 1 and a configuration of the delay circuit 18.

The specification of the semiconductor memory device 1 comprises data rates of the semiconductor memory device 1, clock periods $t_{CK}$s, the CLs and the $t_{RCD}$s. The data rates are selected from a group consisting of 800, 1066, 1333 and 1600 MHz. Because clock frequency of the DDR-SDRAM is half the data rate, the $t_{CK}$s are 2.5, 1.875, 1.5 and 1.25 ns for the data rates of 800, 1066, 1333 and 1600 MHz, respectively. The CL is 5 or 6 for the $t_{CK}$ of 2.5 ns. The CL is 6, 7 or 8 for the $t_{CK}$ of 1.875 ns. The CL is 7, 8 or 9 for the $t_{CK}$ of 1.5 ns. The CL is 8, 9 or 10 for the $t_{CK}$ of 1.25 ns. The $t_{RCD}$s of this embodiment are equal to periods indicated by the CLs, respectively.

The configuration of the delay circuit 18 comprises the numbers of repetitions of the reference delay times, the delay times of the delay circuit 18 and differences between the $t_{RCD}$s and the delay times. The relations between the numbers of repetitions of the reference delay times and the CLs are shown in table 420. Each of the delay times of the delay circuit 18 is approximately equal to a time period obtained by multiplying the $t_{CK}$ to the number of repetitions of the reference delay times. The delay times of this embodiment are in a range from 6.0 to 10.0 ns. The differences between the delay times and the corresponding $t_{RCD}$s are in a range from 3.8 to 5.6 ns.

This application is based on Japanese Patent Application serial no. 2005-335008 filed in Japan Patent Office on Nov. 18, 2005, the contents of which are herein incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be constructed as being included therein.

What is claimed is:

1. A semiconductor memory device configured to delay an input signal in accordance with a clock signal having a clock period comprising:
    a reference signal generator configured to generate a reference signal in accordance with the clock signal, wherein the reference signal indicates a reference delay time representing the clock period; and
    a delay circuit configured to delay input signal for a delay time to generate a delayed signal in accordance with the reference signal, wherein the delay time is obtainable by multiplying the reference delay time by a positive integer.

2. The semiconductor memory device according to the claim 1, wherein:
    the reference delay time is determined by a particular number of a unit delay time; and
    the reference signal transmits the reference delay time in a form of the particular number.

3. The semiconductor memory device according to the claim 2, wherein:
    the reference signal generator comprises a delayed clock signal generator and a signal comparator;
    the delayed clock signal generator comprises 0-th to k-th clock delay elements, wherein the 0-th clock delay element delays the clock signal for the unit delay time to generate a 0-th delayed clock signal, the m-th clock delay element delays the (m−1)-th delayed clock signal for the unit delay time to generates an m-th delayed clock signal where m is an integer from 1 to k;
    the signal comparator compares each of the 0-th to the k-th delayed clock signals with the clock signal and detects the particular number;
    the delay circuit comprises 0-th to n-th delay units, wherein the 0-th to the n-th delay units delays 0-th to n-th input signal to generate 0-th to n-th delayed signals, respectively, the 0-th input signal is the input signal, the (p−1)-th delayed signal is the p-th input signal where the p is an integer from 1 to n, and the n-th delayed signal is the delayed signal; and
    the r-th delay unit comprises a plurality of signal delay elements where r is an integer from 0 to n, wherein the signal delay element delays the r-th input signal for the unit delay time, and the r-th input signal is delayed by s of the signal delay elements where s is the particular number.

4. The semiconductor memory device according to the claim 3, wherein:
    the 0-th to the k-th delayed clock signals are further delayed for a common offset delay time; and
    the 0-th to the n-th delayed signals are further delayed for the common offset delay time.

5. The semiconductor memory device according to the claim 1, further comprising:
    a plurality of word lines;
    a plurality of memory cells selectable by activated word lines;
    a plurality of bit lines configured to transmit signals of selected memory cells; and
    a plurality of sense amplifiers configured to amplify signals on the bit lines, wherein:
    the semiconductor memory device receives a first command and a row address at a first timing, activates the word lines in accordance with the row address, delays the first command to generate a sense amplifier enable signal, receives a second command, receives a column address at a second timing after the second command is received, activates the sense amplifier in response to the sense amplifier enable signal, outputs an amplified signal on the bit lines in accordance with the column address;
    the input signal is the first command; and
    the delayed signal is the sense amplifier enable signal.

6. The semiconductor memory device according to the claim 3, wherein n is selectable.

7. The semiconductor memory device according to the claim 6, further comprising:
    a selection portion for selecting n in accordance with particular number of clock cycles between the first timing and the second timing.

8. The semiconductor memory device according to the claim 7, wherein:
    the semiconductor memory device outputs the amplified signal at a third timing; and
    the particular number is a read latency which shows how many clock cycles should be elapsed between the second timing and the third timing.

9. A semiconductor memory device configured to delay the active command in accordance with a clock signal having a clock period comprising:
    a reference signal generator configured to generate a reference signal in accordance with the clock signal, wherein the reference signal indicates a reference delay time representing the clock period; and
    a sense amplifier enable signal generator configured to delay the active command for a delay time to generate a sense amplifier enable signal in accordance with the reference signal, wherein the delay time is obtainable by multiplying the reference delay time by a positive integer.

10. A semiconductor device comprising:
    a delay time register for storing a reference signal that indicates a reference delay time;
    a plurality of delay units connected in series for delaying an input signal, the delay units being commonly controlled by the reference signal so that a delay time of each delay unit being set to the reference delay time; and
    a selector for selecting one of output signals of the delay units.

11. The semiconductor device according to claim 10, wherein the reference delay time stored in the delay time register is updated in response to a predetermined command.

12. The semiconductor device according to claim 11, wherein the reference delay time indicates a clock cycle of a clock signal at the time the predetermined command is issued.

13. The semiconductor device according to claim 12, further comprising:

a delayed clock signal generator having a plurality of clock delay elements connected in series for delaying the clock signal; and a signal comparator comparing the clock signal with output signals of the clock delay elements so as to select one of output signals of the clock delay elements having substantially the same phase as the clock signal, wherein the reference delay time is updated based on the selected output signals of the clock delay elements.

14. The semiconductor device according to claim 13, wherein the reference delay time indicates a delay time from an active edge of the clock signal to an active edge of the selected output signals of the clock delay elements.

15. The semiconductor device according to claim 13, wherein each delay unit having a plurality of signal delay elements connected in series for delaying an input signal, wherein each signal delay element have substantially the same delay time as the clock delay elements.

16. The semiconductor device according to claim 13, wherein the delayed clock signal generator is brought into an inactive state unless the predetermined command is issued.

17. The semiconductor device according to claim 10, wherein the selector is controlled based on a read latency.

18. A semiconductor device comprising:

a delayed clock signal generator having a plurality of clock delay elements connected in series for delaying a clock signal;

a signal comparator comparing the clock signal with output signals of the clock delay elements so as to select one of output signals of the clock delay elements having substantially the same phase as the clock signal; and a delay circuit delaying an input signal, a delay time of the delay circuit being changed based on which output signal is selected.

19. The semiconductor device according to claim 18, wherein the delayed clock signal generator is brought into an inactive state unless a predetermined command is issued.

20. The semiconductor device according to claim 18, further comprising a delay time register for storing information about which output signal is selected.

* * * * *